United States Patent [19]

Cruz et al.

[11] Patent Number: 4,662,001
[45] Date of Patent: Apr. 28, 1987

[54] TUNABLE NOTCH FILTER FOR IMAGE FREQUENCY AND CONDUCTED LOCAL OSCILLATOR LEAKAGE REJECTION

[75] Inventors: Michael S. Cruz, Des Plaines; Harmon P. Vaughter, Evanston, both of Ill.

[73] Assignee: Zenith Electronics Corporation, Glenview, Ill.

[21] Appl. No.: 766,161

[22] Filed: Aug. 15, 1985

[51] Int. Cl.$^4$ ............................................. H04B 1/26
[52] U.S. Cl. ................................... 455/340; 455/285; 455/302; 455/197; 333/176
[58] Field of Search ............... 455/285, 286, 317, 340, 455/195, 197, 191, 302; 333/176, 177, 178–180

[56] References Cited

U.S. PATENT DOCUMENTS

| | | | |
|---|---|---|---|
| 3,207,990 | 9/1965 | Nestlerode | 455/317 |
| 3,372,337 | 3/1968 | Beres | 455/285 |
| 3,571,767 | 3/1971 | Bush, III | 333/176 |
| 4,291,290 | 9/1981 | Ijichi et al. | 455/191 |
| 4,361,909 | 11/1982 | Theriault | 455/340 |
| 4,601,062 | 7/1986 | Hettiger | 455/340 |

FOREIGN PATENT DOCUMENTS 2909319  9/1980  Fed. Rep. of Germany ...... 455/317

*Primary Examiner*—Jin F. Ng

[57] ABSTRACT

A tunable notch filter for the front end of an RF receiver includes magnetically coupled input and output tunable stages each responsive to a tuning voltage provided thereto. Each of the input and output stages includes a respective series and parallel resonant circuit wherein the parallel resonant circuits are tuned to a selected RF frequency and the series resonant circuits are tuned to a frequency approximately equal to that of a local oscillator. By using the series resonant circuits to create a notch at a frequency approximating that of the local oscillator, conducted local oscillator leakage from the receiver's antenna is substantially reduced and local oscillator image frequency rejection is substantially improved.

22 Claims, 2 Drawing Figures

TUNABLE NOTCH FILTER FOR IMAGE FREQUENCY AND CONDUCTED LOCAL OSCILLATOR LEAKAGE REJECTION

BACKGROUND OF THE INVENTION

This invention relates generally to RF filter circuits and is particularly directed to a tunable notch filter for the front end of an RF receiver for reducing conducted local oscillator leakage and improving radio frequency image rejection.

A conventional radio frequency signal receiver includes a radio frequency (RF) section and an intermediate frequency (IF) section. Included in the RF section are tuned RF filters to provide coarse filtering for a band of frequencies centered about a selected channel. The output of the RF filters is provided to an RF amplifier which typically has a gain of at least 20 to 30 dB as in a conventional television receiver. The output of the RF amplifier is provided to one input of a mixer circuit, while a second input of the mixer receives a signal from a local oscillator which is offset in frequency from the selected channel by a given amount for generating a heterodyned lower, intermediate frequency (IF) signal. In a television receiver, the IF signal frequency is approximately 45 MHz. The output of the mixer is filtered and amplified in an IF stage.

While the heterodyning of the selected RF signal and the local oscillator generated signal in the mixer thus produces the desired 45 MHz IF signal, an undesired 45 MHz signal may also be produced in response to the heterodyning of the local oscillator signal with a received RF signal having a frequency 90 MHz higher than the selected frequency (commonly referred to as the image frequency). This undesired 45 MHz component manifests itself as a spurious beat in the processed video signal and degrades the resulting video image. In addition, the local oscillator signal is frequently provided via the mixer to not only the IF stage, but also back to the antenna resulting in unwanted transmissions from the receiving antenna in violation of federal communications regulations.

The present invention is intended to eliminate the aforementioned problems in a wide band RF receiver by providing a tunable notch filter for image frequency rejection and conducted local oscillator leakage reduction for use in the interstage portion of the receiver's front end. In response to a tuning voltage provided thereto, the tunable notch filter is not only tuned to a desired RF frequency, or channel, but also is de-tuned to a frequency approximately equal to that of the local oscillator so as to exhibit a notch in its frequency response thereat.

OBJECTS OF THE INVENTION

Accordingly, it is an object of the present invention to provide an improved RF signal filter particularly adapted for use in a wide band RF receiver.

It is another object of the present invention to provide improved frequency response in a wideband RF tuner.

A still further object of the present invention is to provide a tunable RF frequency notch filter of simplified construction which can be mass produced at a low cost.

Still another object of the present invention is to provide improved isolation between the antenna and the local oscillator in a heterodyned RF receiver.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, in which:

DETAILED DESCRIPTION OF THE PREFERRED EMBODIMENT

Figure 1:
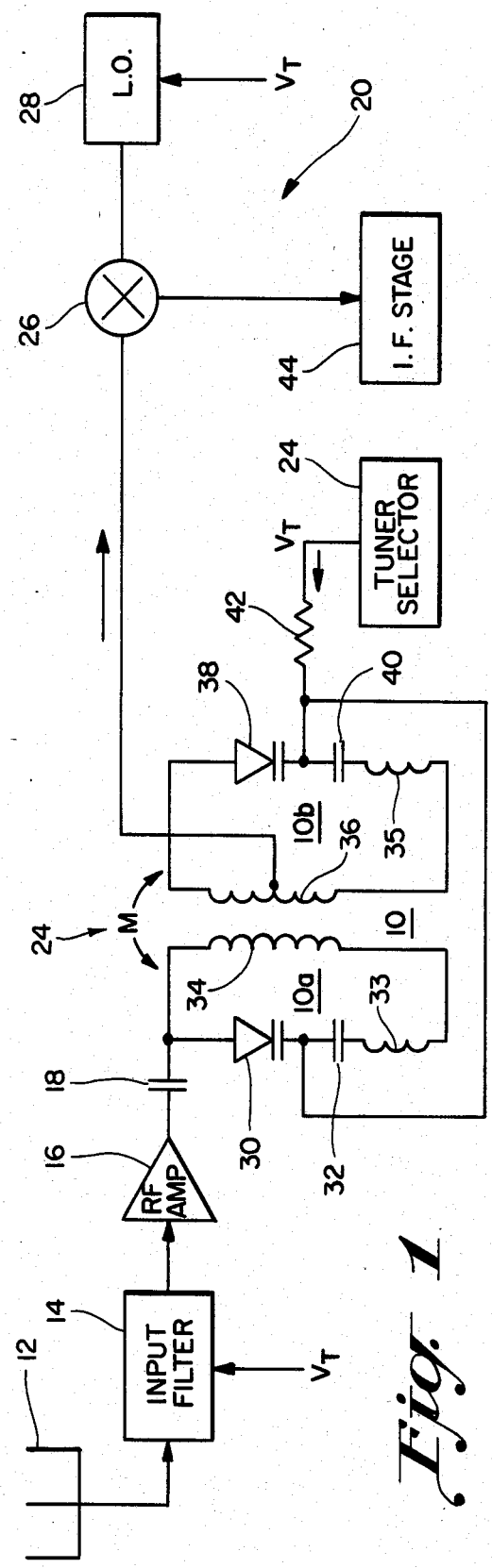
FIG. 1 is a simplified block and schematic diagram of a tunable notch filter for image rejection and conducted local oscillator leakage in accordance with the present invention.

Referring to FIG. 1, there is shown a tunable notch filter 10 for image rejection and conducted local oscillator leakage for use in the front end of an RF receiver 20.

The RF receiver front end 20 includes an antenna 12 responsive to an RF signal incident thereon. The antenna 12 is coupled to a tuned input filter 14 which, in turn, is coupled to a wide band RF amplifier 16. The RF amplifier 16 is coupled via an AC coupling capacitor 18 to an interstage tuned coupling circuit 24. The interstage tuned coupling circuit 24 couples the tuned RF signal output from the RF amplifier 16 to a mixer circuit 26. Also coupled to the mixer circuit 26 is a local oscillator frequency signal from a local oscillator 28. The local oscillator 28 operates in a conventional television receiver at a frequency approximately 45 MHz greater than the tuned RF signal frequency. Heterodyning of the received RF signal and the local oscillator signal within the mixer circuit 26 produces an IF signal of 45 MHz which is provided to an IF stage 44 in the RF receiver front end 20. The IF stage 44 is adapted to process the IF signal in a well-known manner. The configuration and operation of the RF receiver front end 20 thus far described is conventional in nature and applies generally to virtually any RF signal receiver.

In accordance with the present invention, the interstage tuned coupling circuit 24 is coupled to a tuner selector 24 via a current limiting resistor 42 and is responsive to a tuning voltage ($V_T$) for passing a desired RF frequency signal from the RF amplifier 16 to the mixer circuit 26. The tuning voltage $V_T$ is also coupled to tuned input filter 14 and to local oscillator 28 to facilitate tuning of a selected channel. The tuner selector 24 may be conventional in nature and may range from a discrete component circuit arrangement for providing an analog tuning voltage $V_T$ to a microcomputer-controlled digital tuning selector system of the type which are increasingly being utilized in modern television receivers.

The interstage tuned coupling circuit 24 includes the tunable notch filter 10 of the present invention. The tunable notch filter 10 includes an input stage 10a which is coupled to the RF amplifier 16 via the aforementioned AC coupling capacitor 18 and an output stage 10b which is coupled to the mixer circuit 26. The input and output stages 10a, 10b of the tunable notch filter 10 are each coupled to the tuner selector 24 and are responsive to the tuning voltage $V_T$ received therefrom. The tuning voltage tunes each of the input and output stages 10a, 10b to a desired frequency in accordance with user inputs provided to the tuner selector 24.

The input and output stages 10a, 10b of the tunable notch filter 10 respectively include first and second parallel inductors 34, 36 which are magnetically coupled. The input stage 10a further includes a first varactor diode 30, a first padder capacitor 32 and a first series inductor 33 all coupled in series. The series arrangement of the first varactor diode 30, the first padder capacitor 32 and the first series inductor 33 is further coupled in parallel across the first parallel inductor 34. Similarly, the output stage 10b of the tunable notch filter 10 further includes a second varactor diode 38, a second padder capacitor 40 and a second series inductor 35 coupled in series. This serial arrangement of the second varactor diode 38, the second padder capacitor 40 and the second series inductor 35 is coupled in parallel across the second parallel inductor 36. The first and second varactor diodes 30, 38 are each responsive to the tuning voltage $V_T$ provided to the respective cathodes thereof, which cathodes are also respectively coupled to the first and second padder capacitors 32, 40. By thus varying the tuning voltage $V_T$ applied to the tunable notch filter 10, the frequency to which the input and output stages 10a, 10b thereof are tuned may be selectively controlled by appropriately varying the capacitance exhibited by the varactor diodes 30, 38.

The received RF signal is magnetically coupled from the first parallel inductor 34 to the second parallel inductor 36. The mixer 26 is coupled to a winding of the second parallel inductor 36. Magnetic coupling between the input and output stages 10a, 10b of the tunable notch filter 10 provides a high degree of isolation between the antenna 12 and the mixer 26. This isolation is desirable to prevent leakage via the mixer circuit 26 from the local oscillator 28 from reaching the antenna 12 and being radiated therefrom. Transmission of the local oscillator signal to the antenna 12 not only interferes with reception and processing of the RF signal provided to the RF receiver front end 20, but also results in the propagation of a transmitted signal giving rise to the possibility of signal reception interference in other RF receivers in violation of government imposed communications regulations.

The tunable notch filter input stage 10a thus includes a series resonant circuit comprised of the first varactor diode 30, the first padder capacitor 32 and the first series inductor 33. Similarly, the filter output stage 10b includes a corresponding series resonant circuit comprised of the second varactor diode 38, the second padder capacitor 40 and the second series inductor 35. The filter input stage 10a also includes a parallel resonant circuit comprised of the aforementioned series coupled components which are coupled across and in parallel with the first parallel inductor 34. Similarly, the filter output stage 10b includes a parallel resonant circuit comprised of the aforementioned series connected components which are coupled in parallel across the second parallel inductor 36. In each of the aforementioned filter stages, the series resonant frequency is greater than the parallel resonant frequency and is expressed in Equation 1.

$$f_{SERIES} = \frac{1}{2\pi \sqrt{L_{SERIES} \left( \frac{C_{VARACTOR} \times C_{PADDER}}{C_{VARACTOR} + C_{PADDER}} \right)}} \quad (1)$$

Similarly, the parallel resonant frequency is expressed in Equation 2.

$$f_{PARALLEL} = \frac{1}{2\pi \sqrt{(L_{PARALLEL} + L_{SERIES}) \left( \frac{C_{VARACTOR} C_{PADDER}}{C_{VARACTOR} + C_{PADDER}} \right)}} \quad (2)$$

The values of each of the aforementioned capacitors and series and parallel inductors as well as the operating characteristics of the aforementioned varactor diodes are selected such that in response to receipt of the tuning voltage $V_T$ from the tuner selector 24, each of the aforementioned parallel resonant circuits is tuned to a desired RF frequency, while each of the aforementioned series resonant circuits is tuned to a notch frequency which is approximately 45 MHz greater than the frequency to which the aforementioned parallel resonant circuits are tuned. The notch frequency is thus approximately equal to the local oscillator signal frequency with the tunable notch filter 10 thus filtering out the conducted local oscillator leakage and substantially preventing the local oscillator signal from being transmitted via the interstage tuned coupling circuit 24 to the antenna 12. In addition, image frequency rejection is provided by the increased attenuation of the notch filter at the image frequency located 45 MHz above the local oscillator frequency (i.e., 90 MHz above the tuned RF signal).

Figure 2:
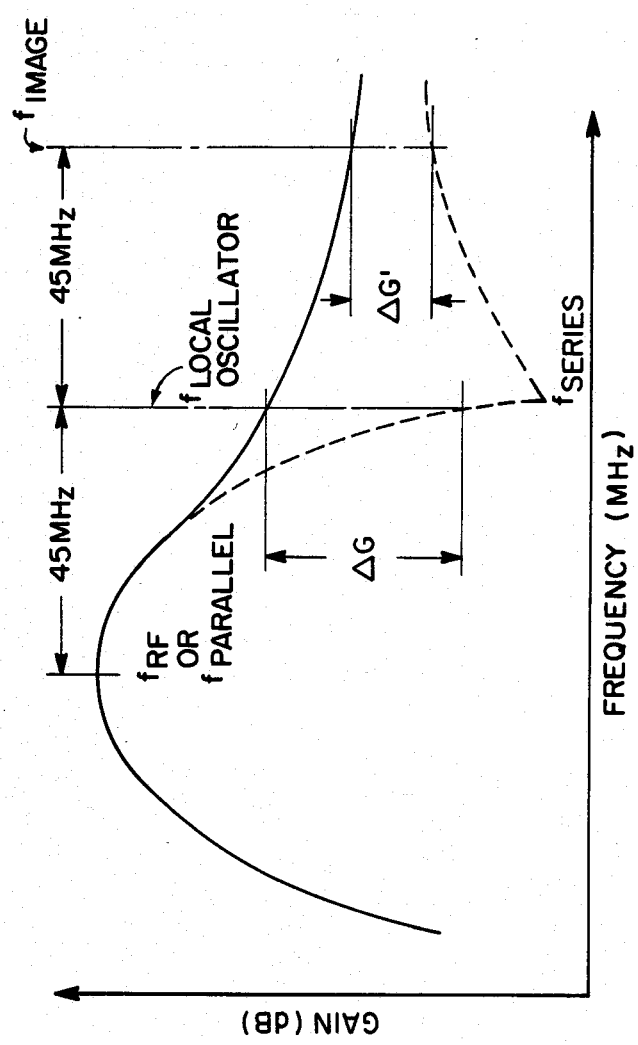
FIG. 2 is a graph showing the frequency response of the tunable notch filter for image rejection and conducted local oscillator leakage in accordance with the present invention, wherein the abscissa indicates the frequency and the ordinate indicates the gain or response characteristic of the filter.

The operation of the tunable notch filter 10 of the present invention is graphically shown in FIG. 2, wherein its characteristic frequency response is illustrated with the abscissa of the graph shown therein representing frequency and the ordinate thereof representing the gain or response characteristic of the tunable notch filter. The frequency response, or gain, of a conventional interstage tuned filter is shown by the continuous, or solid line in FIG. 2. A conventional RF filter thus is tuned to a desired RF frequency and exhibits a gradually reduced response characteristic with increasing frequency. From FIG. 2, it can be seen that for a conventional RF filter, the response at the local oscillator frequency which is approximately 45 MHz greater than the tuned RF frequency and the response at the image frequency, which is approximately 90 MHz greater than the tuned RF signal, although reduced from that at the received RF frequency, is still considerably greater than desired. By tuning each of the series resonant circuits in the filter input and output stages 10a, 10b to a notch frequency approximately equal to the local oscillator frequency, the tunable notch filter 10 of the present invention substantially reduces the response of the RF receiver front end 20 at the local oscillator frequency as well as at the image frequency for substantially attenuating these unwanted frequency components.

As shown in FIG. 2, the decrease in frequency response by tuning the parallel resonant circuits in each of the filter input and output stages 10a, 10b to a desired RF frequency and tuning each of the series resonant circuits therein approximately to the local oscillator frequency is indicated as ΔG at the local oscillator frequency. Similarly, the decrease in the response of the tunable notch filter 10 at the image frequency, or approximately 90 MHz higher than the desired RF frequency, is shown as ΔG'. By thus adding a series inductance to the series resonance present in the capacitive leg of each of the aforementioned parallel resonant LC circuits, the series resonance may be tuned to a frequency between the local oscillator frequency ($F_{RF}+45$ MHz) and the image frequency ($F_{RF}+90$ MHz). In a preferred embodiment of the present invention, the series resonant circuits are tuned to a notch frequency which is approximately 10 MHz greater than the local oscillator frequency. Since the capacitance of each of the aforementioned varactor diodes 30, 38 varies with the tuning voltage $V_T$ applied thereto, the varying capacitance of the aforementioned varactor diodes determines both the parallel resonance of the RF bandpass as well as the series resonance of the series trap circuit. The tunable notch filter 10 of the present invention thus provides two circuits which track each other in frequency.

In a preferred embodiment, when the tunable notch filter of the present invention is used in the front end of a UHF receiver the following approximate values are assigned to the various components therein:

Varactor Diodes 30, 38: 2.5–40 picofarads;
Parallel Inductors 34, 36: 10 nanohenries;
Serial Inductors 33, 35: 4 nanohenries; and
Capacitors 32, 40: 20 picofarads.

There has thus been shown a tunable notch filter for conducted local oscillator leakage reduction and image frequency rejection which is responsive to a single tuning voltage for tuning a pair of magnetically coupled parallel resonant circuits to a desired RF frequency, while tuning a pair of series resonant circuits, each of which forms a portion of one of the aforementioned parallel resonant circuits, to a notch frequency approximately equal to the receiver's local oscillator frequency. By thus providing a notch frequency near the local oscillator frequency and between the image frequency and the desired RF frequency, the image frequency is in effect removed from the received RF signal and the local oscillator frequency signal is prevented from reaching the receiver's antenna and from being radiated therefrom.

While particular embodiments of the present invention have been shown and described, it will be obvious to those skilled in the art that changes and modifications may be made without departing from the invention in its broader aspects. For example, only one of the stages of the tunable notch filter 10 may be provided with a notch frequency in its series resonant circuit. Thus, only the output stage 10b of the tunable notch filter may include a series inductor such as element 35 therein, while the other series inductor 33 may be omitted from the input stage 10a which then only includes a parallel resonant circuit tuned to a desired RF frequency and does not exhibit a notch frequency. In addition, the tunable notch filter of the present invention may be used in another portion of the front end of an RF receiver. For example, the tunable notch filter 10 may be used in the input filter 14 of the RF receiver front end 20 shown in FIG. 1. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In an RF receiver generating an IF signal having desired and undesired components by heterodyning a local oscillator signal with a selected RF signal and an image frequency signal respectively, the improved tuning arrangement comprising:
    tuning means for generating a tuning voltage representing the selected RF signal; and
    a filter circuit including a parallel resonant circuit having tunable means coupled to said tuning means and responsive to said tuning voltage for assuming in response to said tuning voltage a parallel resonance for establishing a maximum response at the frequency of said selected RF signal, said parallel resonant circuit further comprising a series resonance circuit including said tunable means for assuming in response to said tuning voltage a series resonance for establishing a notch near the frequency of said local oscillator signal so as to pass the selected RF signal while attenuating the local oscillator and image frequency signals.

2. The arrangement of claim 1 wherein said tunable means comprises a common variable capacitance means responsive to said tuning voltage for tuning said parallel and series resonant circuits.

3. The arrangement of claim 2 wherein said series resonant circuit includes a fixed capacitance and a first inductor coupled in series with said variable capacitance means.

4. The arrangement of claim 3 wherein said parallel resonant circuit includes the series arrangement of said variable capacitance means, said fixed capacitance and said first inductor and further includes a second inductor coupled in parallel across said series arrangement.

5. The arrangement of claim 4 wherein said variable capacitance means comprises a varactor diode.

6. The arrangement of claim 5 wherein the RF receiver includes a pair of said filter circuit selectromagnetically coupled together by means of their respective second inductors.

7. The arrangement of claim 1 wherein said notch is between the local oscillator frequency and the image frequency signal.

8. The arrangement of claim 1 wherein the RF receiver includes an interstage tuned coupling circuit having an output stage comprised of said filter circuit.

9. In an RF receiver generating an IF signal having desired and undesired components by heterodyning a local oscillator signal with a selected RF signal and an image frequency signal respectively, the improved tuning arrangement comprising:
    tuning means for generating a tuning voltage representing the selected RF signal; and
    filter means comprising a parallel circuit and a series circuit sharing a common varactor diode, the varactor diode being responsive to the tuning voltage for causing the parallel circuit to resonate for establishing a maximum response at the frequency of the selected RF signal and the series circuit to resonate for establishing a notch between the frequencies of the local oscillator and image frequency signals so as to pass the selected RF signal while attenuating the local oscillator and image frequency signals.

10. The arrangement of claim 9 wherein said series circuit comprises a fixed capacitance and a first inductor coupled in series with said varactor diode.

11. The arrangement of claim 10 wherein said parallel circuit comprises a second inductor coupled in parallel across said series circuit.

12. In an RF receiver including an antenna responsive to an RF signal incident thereon and a mixer responsive to the RF signal and coupled to a local oscillator and further responsive to a local oscillator frequency signal output therefrom for combining said RF and local oscillator frequency signals in a heterodyned manner for generating an IF signal, said RF receiver further including tuning means for generating a tuning voltage for tuning said RF receiver over a range of RF frequencies, a tunable notch filter comprising:
an input stage coupled to the antenna for receiving the RF signal and including first coupled tunable parallel and series resonant circuits, wherein said input stage is coupled to the tuning means and is responsive to the tuning voltage received therefrom and wherein the tuning voltage tunes said first parallel resonant circuit to a desired frequency and tunes said first series resonant circuit to a notch frequency approximately equal to the frequency of the local oscillator signal; and
an output stage magnetically coupled to said input stage and including second coupled tunable parallel and series resonant circuits, wherein said output stage is coupled to the mixer and to the tuning means and is responsive to the tuning voltage received therefrom and wherein the tuning voltage tunes said second parallel resonant circuit to said desired frequency and tunes said second series resonant circuit to said notch frequency.

13. The tunable notch filter of claim 12 wherein said first parallel resonant circuit is coupled to the antenna for receiving an RF signal incident thereon.

14. The tunable notch filter of claim 13 wherein said second parallel resonant circuit is coupled to the mixer for providing a received RF signal thereto.

15. The tunable notch filter of claim 14 wherein said first and second parallel resonant circuits include respective parallel inductors magnetically coupled to each other.

16. The tunable notch filter of claim 15 wherein said first parallel and series resonant circuits include first variable capacitance means and said second parallel and series resonant circuits include second variable capacitance means, said first and second variable capacitance means coupled to the tuning means and responsive to a tuning voltage output therefrom for tuning respective coupled pairs of parallel and series resonant circuits to a desired RF signal frequency and to said notch frequency, respectively.

17. The tunable notch filter of claim 16 wherein said first and second variable capacitance means respectively comprise first and second varactor diodes.

18. The tunable notch filter of claim 17 wherein the tuning means is coupled to a respective cathode of said first and second varactor diodes for providing the tuning voltage thereto.

19. The tunable notch filter of claim 18 wherein said first series resonant circuit includes a first series inductance and a first fixed capacitance coupled in series with said first varactor diode and wherein said first series resonant circuit is coupled across a first respective parallel inductor.

20. The tunable notch filter of claim 19 wherein said second series resonant circuit includes a second series inductance and a second fixed capacitance coupled in series with said second varactor diode and wherein said second series resonant circuit is coupled across a second respective parallel inductor.

21. The tunable notch filter of claim 12 for use in a television receiver wherein the range of RF frequencies includes the UHF band.

22. The tunable notch filter of claim 21 wherein said notch frequency is approximately 45 MHz.

* * * * *